United States Patent
Takimoto et al.

(10) Patent No.: US 11,088,118 B2
(45) Date of Patent: Aug. 10, 2021

(54) SEMICONDUCTOR DEVICE

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Kazuyasu Takimoto, Fuchu (JP); Yuta Ichikura, Musashimurayama (JP); Toshiharu Ohbu, Kawasaki (JP); Hiroaki Ito, Suginami (JP); Naotake Watanabe, Fuchu (JP); Nobumitsu Tada, Hachioji (JP); Naoki Yamanari, Fuchu (JP); Daisuke Hiratsuka, Yokohama (JP); Hiroki Sekiya, Kawasaki (JP); Yuuji Hisazato, Fuchu (JP); Naotaka Iio, Saitama (JP); Hitoshi Matsumura, Yokohama (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 141 days.

(21) Appl. No.: 16/464,355

(22) PCT Filed: Nov. 30, 2017

(86) PCT No.: PCT/JP2017/043053
§ 371 (c)(1),
(2) Date: May 28, 2019

(87) PCT Pub. No.: WO2018/105486
PCT Pub. Date: Jun. 14, 2018

(65) Prior Publication Data
US 2020/0321320 A1    Oct. 8, 2020

(30) Foreign Application Priority Data
Dec. 6, 2016 (JP) .............................. JP2016-236408

(51) Int. Cl.
*H01L 25/07* (2006.01)
*H01L 23/367* (2006.01)
(Continued)

(52) U.S. Cl.
CPC .......... *H01L 25/072* (2013.01); *H01L 23/367* (2013.01); *H01L 23/50* (2013.01); *H01L 25/18* (2013.01); *H01L 29/0619* (2013.01)

(58) Field of Classification Search
None
See application file for complete search history.

(56) References Cited

U.S. PATENT DOCUMENTS

| 5,708,299 A | 1/1998 | Teramae et al. |
| 2004/0089925 A1* | 5/2004 | Fukuda ................. H01L 25/072 257/676 |

(Continued)

FOREIGN PATENT DOCUMENTS

| JP | 3258200 B2 | 2/2002 |
| JP | 2005-116875 A | 4/2005 |

(Continued)

OTHER PUBLICATIONS

International Search Report dated Feb. 27, 2018, in PCT/JP2017/043053 filed on Nov. 30, 2017.

*Primary Examiner* — Hsien Ming Lee
(74) *Attorney, Agent, or Firm* — Oblon, McClelland, Maier & Neustadt, L.L.P.

(57) ABSTRACT

According to an embodiment, a semiconductor device includes a first metal plate, a second metal plate, and two or more semiconductor units. The two or more semiconductor units are disposed on the first metal plate. The each of the two or more semiconductor units includes a first metal member, a second metal member, and a semiconductor element. The first metal member has a first connection (Continued)

surface connected to the first major surface. The second metal member has a second connection surface connected to the second major surface. The semiconductor element includes an active region having surfaces respectively opposing the first connection surface and the second connection surface. A surface area of the first connection surface is greater than a surface area of the surface of the active region opposing the first connection surface. A surface area of the second connection surface is greater than a surface area of the surface of the active region opposing the second connection surface.

9 Claims, 9 Drawing Sheets

(51) Int. Cl.
*H01L 23/50* (2006.01)
*H01L 25/18* (2006.01)
*H01L 29/06* (2006.01)

(56) References Cited

U.S. PATENT DOCUMENTS

| | | |
|---|---|---|
| 2005/0077617 A1 | 4/2005 | Hirano et al. |
| 2015/0077941 A1* | 3/2015 | Hosseini ............ H01L 23/3736 361/704 |
| 2016/0126205 A1* | 5/2016 | Kadoguchi ....... H01L 23/49562 257/736 |
| 2019/0057921 A1* | 2/2019 | Ooshima ................ H01L 23/29 |

FOREIGN PATENT DOCUMENTS

| | | |
|---|---|---|
| JP | 4385324 B2 | 12/2009 |
| JP | 2011-211017 A | 10/2011 |
| JP | 2013-93631 A | 5/2013 |
| JP | 2018-81980 A | 5/2018 |
| WO | WO 2016/076015 A1 | 5/2016 |

* cited by examiner

US 11,088,118 B2

SEMICONDUCTOR DEVICE

TECHNICAL FIELD

Embodiments of the invention relate to a semiconductor device.

BACKGROUND ART

In a semiconductor device handling a high voltage of several kilovolts (kV) and/or a large current of several kiloamperes (kA), it is necessary to suppress the temperature increase when operating as much as possible; and there are cases where switching elements are operated by being multiply connected in parallel.

There is a semiconductor module in which multiple switching elements connected in parallel are mounted in a single package. In such a semiconductor module, it is necessary to realize a low thermal resistance and ensure good safety.

Prior Art Document

Patent Document

[Patent Document 1] Japanese Patent No. 3258200
[Patent Document 2] Japanese Patent No. 4385324

SUMMARY OF INVENTION

Problem to be Solved by the Invention

An object of an embodiment is to provide a highly safe semiconductor device in which a large current output is possible.

Means for Solving the Problem

A semiconductor device according to an embodiment includes a first metal plate, a second metal plate provided to be separated from the first metal plate, and two or more semiconductor units disposed on the first metal plate and connected to the second metal plate. Each of the two or more semiconductor units includes a first metal member electrically connected to the first metal plate, a second metal member electrically connected to the second metal plate and provided to be separated from the first metal member, and a semiconductor element provided between the first metal member and the second metal member, connected to the first metal member at a first major surface, and connected to the second metal member at a second major surface on a side opposite to the first major surface. The first metal member has a first connection surface connected to the first major surface. The second metal member has a second connection surface connected to the second major surface. The semiconductor element includes an active region having surfaces respectively opposing the first connection surface and the second connection surface. A surface area of the first connection surface is greater than a surface area of the surface of the active region opposing the first connection surface. A surface area of the second connection surface is greater than a surface area of the surface of the active region opposing the second connection surface.

MODES FOR CARRYING OUT THE INVENTION

Embodiments of the invention will now be described with reference to the drawings.

First Embodiment

Figure 1:
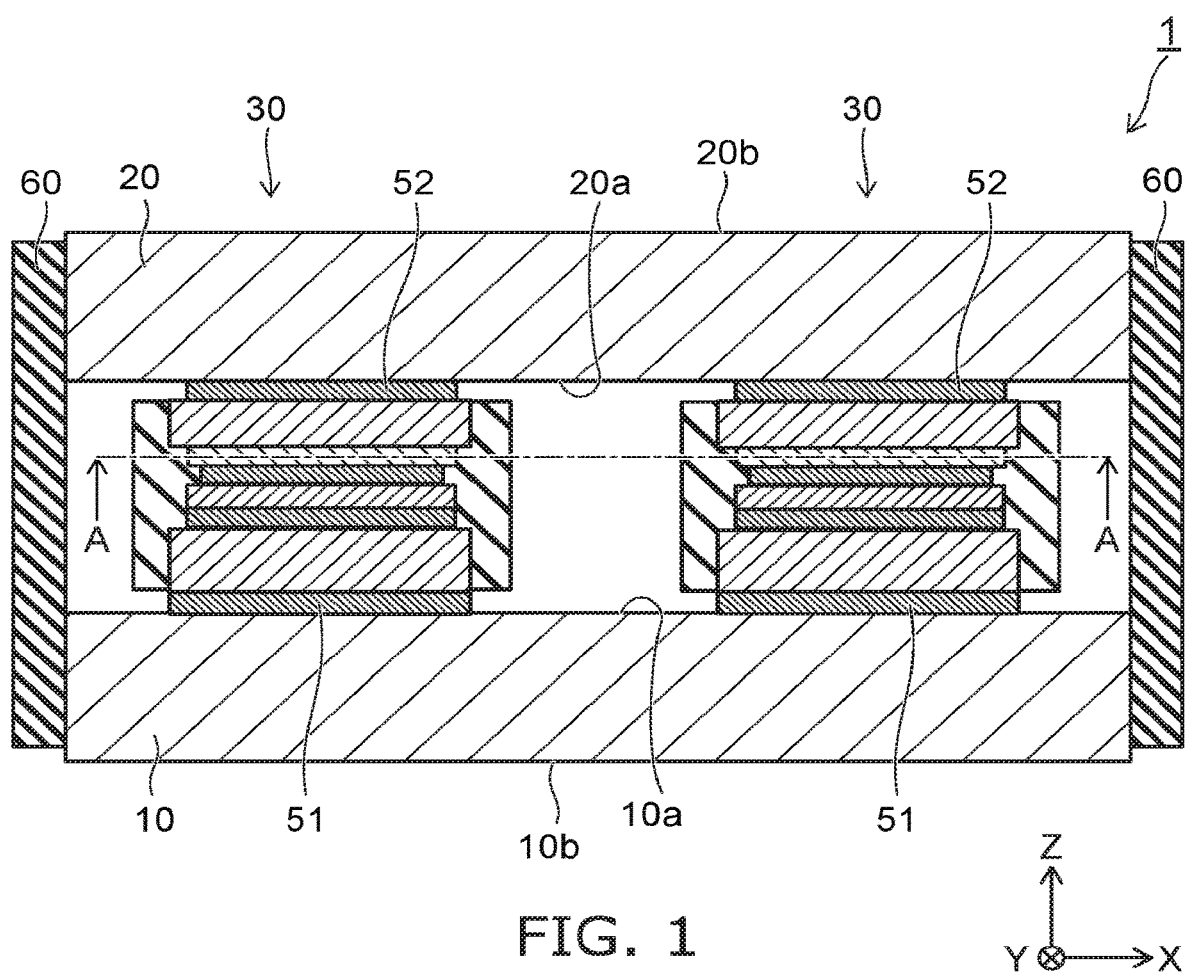
FIG. 1 is a cross-sectional view illustrating a semiconductor device according to a first embodiment.

FIG. 1 is a cross-sectional view illustrating a semiconductor device according to the embodiment.

Figure 2:
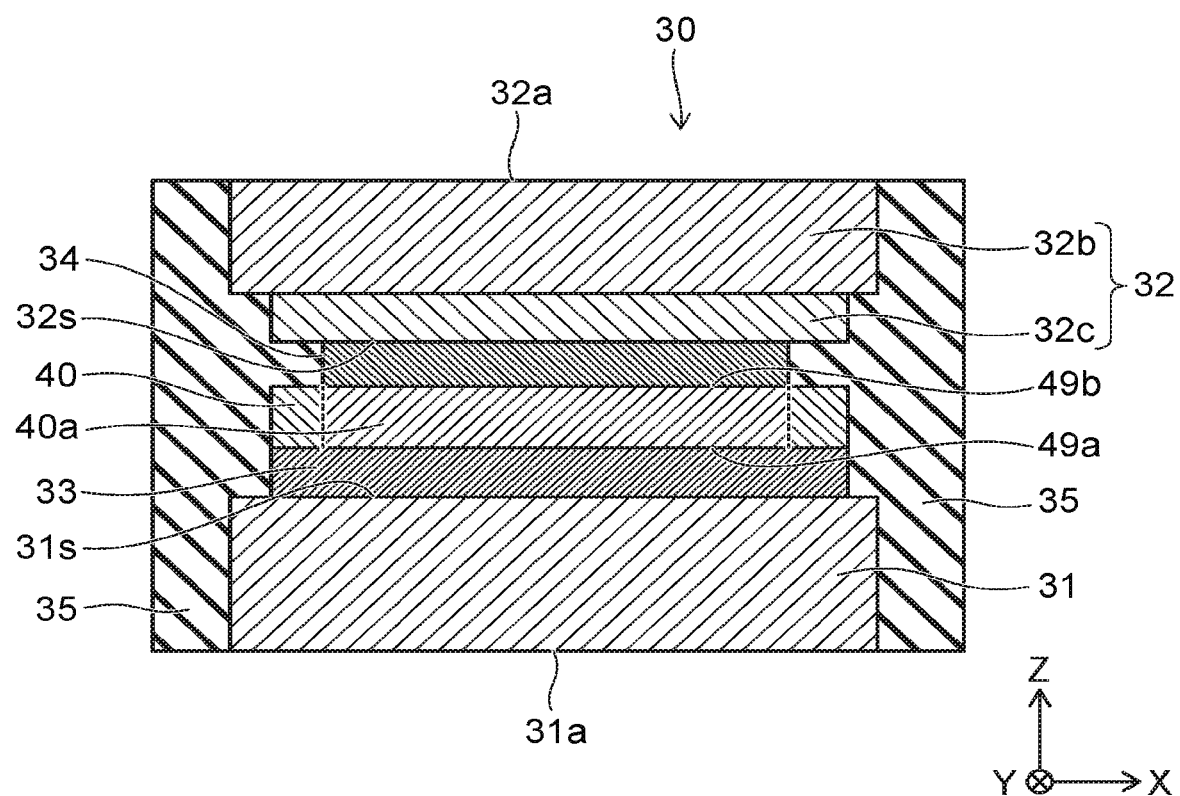
FIG. 2 is a cross-sectional view illustrating a portion of the semiconductor device of the first embodiment.

FIG. 2 is a cross-sectional view illustrating a portion of the semiconductor device of the embodiment.

Figure 3:
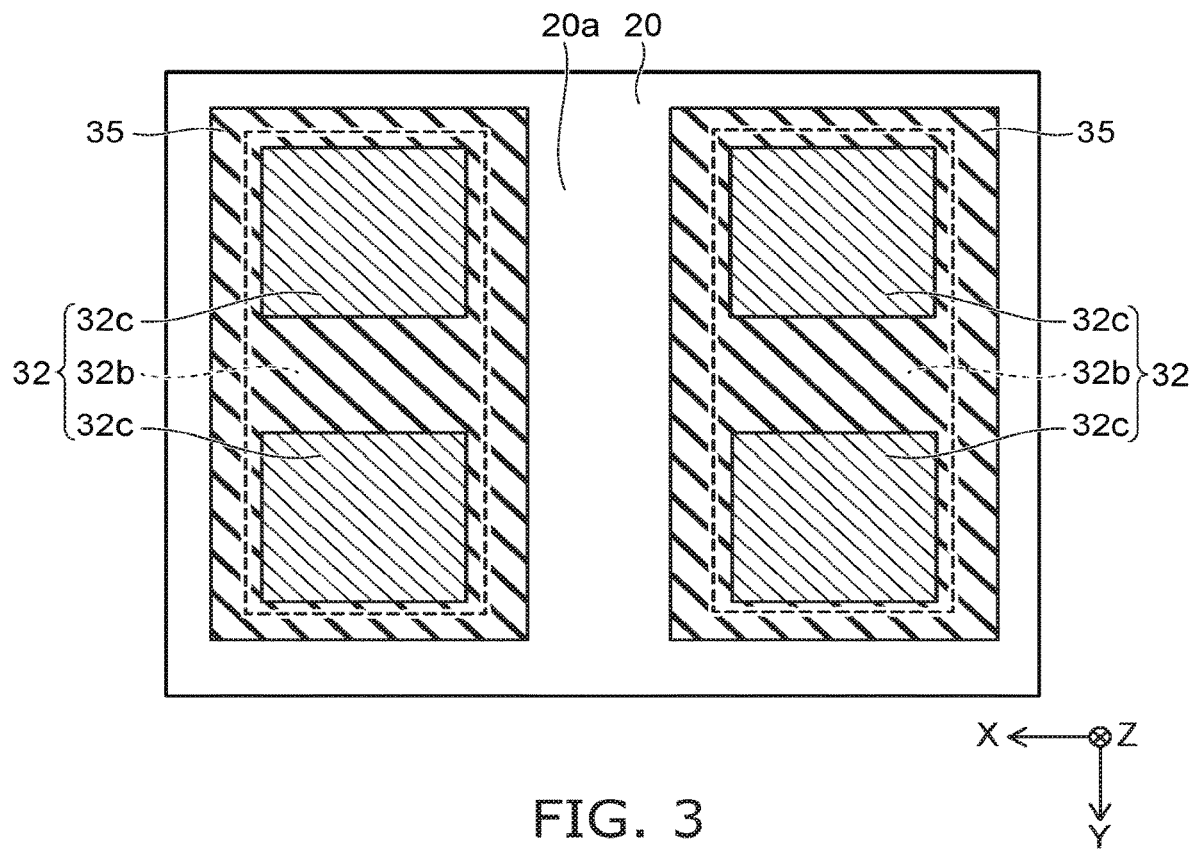
FIG. 3 is an example of an auxiliary cross-sectional view of line AA of FIG. 1.

FIG. 3 is an example of an auxiliary cross-sectional view of line AA of FIG. 1.

Figure 4:
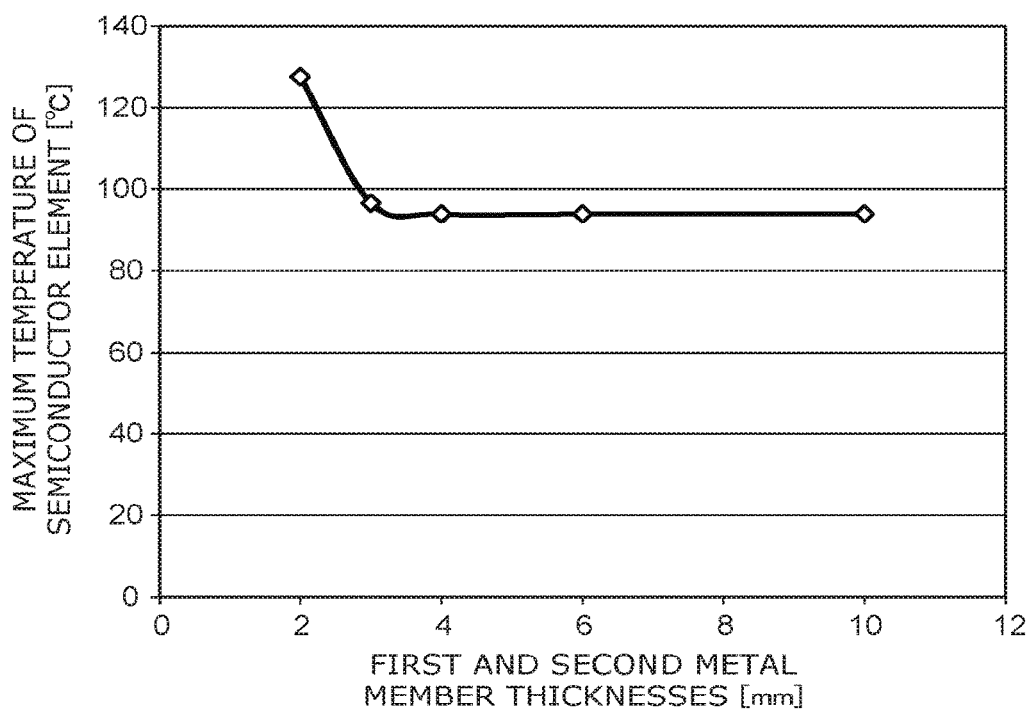
FIG. 4 is a graph illustrating a characteristic of the semiconductor device of the embodiment.

FIG. 4 is a graph illustrating a characteristic of the semiconductor device of the embodiment.

As shown in FIG. 1, the semiconductor device 1 of the embodiment includes a first metal plate 10, a second metal plate 20, and a semiconductor unit 30. The first metal plate 10 has a first surface 10a and a second surface 10b. The second metal plate 20 has a first surface 20a and a second surface 20b.

In the description hereinbelow, the following coordinates may be used. Coordinate axes that are parallel to the first surface 10a which is one surface of the first metal plate 10 are taken as an X-axis and a Y-axis. Then, a coordinate axis orthogonal to the X-axis and the Y-axis is taken as a Z-axis.

The second metal plate 20 is disposed so that the first surface 20a which is one surface opposes the first surface 10a of the first metal plate 10 and is substantially parallel to the first surface 10a. That is, the first surfaces 10a and 20a are disposed to be substantially parallel.

The first metal plate 10 is a substantially rectangular flat plate having the first surface 10a parallel to the XY plane. The first metal plate 10 has a thickness in the Z-axis direction.

The second metal plate 20 is a substantially rectangular flat plate having the first surface 20a parallel to the XY plane. The second metal plate 20 has a thickness in the Z-axis direction. The second metal plate 20 is substantially the same flat plate as the first metal plate 10.

The first metal plate 10 and the second metal plate 20 are formed of metals having a high electrical conductivity and a high thermal conductivity. For example, the first metal plate 10 and the second metal plate 20 include copper (Cu) or a copper alloy. The first metal plate 10 and the second metal plate 20 function as two electrodes of the semiconductor device 1.

The second surface 10b of the first metal plate 10 and the second surface 20b of the second metal plate 20 are substantially parallel flat surfaces; and, for example, the heat dissipation performance of the semiconductor device 1 can be improved by mounting heat sinks, etc., to these surfaces.

One or more semiconductor units 30 are provided between the first metal plate 10 and the second metal plate 20. In the case where two or more semiconductor units 30 are provided, each of the semiconductor units 30 is electrically connected to the first metal plate 10 via a first connection member 51 and electrically connected to the second metal plate 20 via a second connection member 52. The semiconductor units 30 are connected in parallel.

A case 60 is additionally provided at the side surfaces of the first metal plate 10 and the second metal plate 20. The first metal plate 10, the first connection member 51, the semiconductor unit 30, the second connection member 52, and the second metal plate 20 are enclosed with the case 60. The case 60 prevents the penetration of foreign matter, etc., from outside the semiconductor device 1.

As shown in FIG. 2, the semiconductor unit 30 includes a first metal member 31, a second metal member 32, a first bonding member 33, a second bonding member 34, an insulating member 35, and a semiconductor element 40. The first metal member 31, the first bonding member 33, the semiconductor element 40, the second bonding member 34, and the second metal member 32 are stacked in the Z-axis direction in this order. A portion of the first metal member 31, a portion of the second metal member 32, the first bonding member 33, the second bonding member 34, and the semiconductor element 40 are covered with the insulating member 35.

The semiconductor unit 30 includes a first terminal 31a and a second terminal 32a. The first terminal 31a is a portion of the first metal member 31 not covered with the insulating member 35. The second terminal 32a is a portion of the second metal member 32 not covered with the insulating member 35.

The semiconductor unit 30 has a substantially rectangular parallelepiped configuration having surfaces substantially parallel to the XY plane, the XZ plane, and the YZ plane. The first terminal 31a is an exposed surface of the semiconductor unit 30 parallel to the XY plane. The first terminal 31a is a surface of the first metal member 31 and is provided to oppose the first surface 10a of the first metal plate 10.

The second terminal 32a is an exposed surface of the semiconductor unit 30 parallel to the XY plane and is an exposed surface opposing the surface where the first terminal 31a is formed. The second terminal 32a is a surface of the second metal member 32 and is provided to oppose the first surface 20a of the second metal plate 20.

The second metal member 32 includes portions 32b and 32c. The portion 32b is a substantially rectangular plate-like member; and the portion 32c is a protrusion protruding from the portion 32b toward the semiconductor element 40 side. The surface of the portion 32c on the semiconductor element 40 side is flat and is connected to the semiconductor element 40.

The semiconductor element 40 has a first major surface 49a and a second major surface 49b. The first major surface 49a is a surface facing the first metal member 31. The semiconductor element 40 is electrically connected to the first metal member 31 via the first bonding member 33 at the first major surface 49a. The second major surface 49a is the surface on the side opposite to the first major surface 49a. The semiconductor element 40 is electrically connected to the second metal member 32 via the second bonding member 34 at the second major surface 49a. For example, electrodes are formed of metal materials, etc., on each of the first major surface 49a and the second major surface 49a; and the electrodes of the semiconductor element 40 are electrically connected to the first bonding member 33 and the second bonding member 34.

The semiconductor element 40 includes an active region 40a shown by broken lines. For example, the active region 40a spreads from the central portion toward the outer perimeter of the semiconductor element 40 when projected onto the XY plane. The semiconductor element 40 is, for example, a FRD (Fast Recovery Diode). The semiconductor element 40 may be a switching element such as an IGBT (Insulated Gate Bipolar Transistor), a MOSFET (Metal Oxide Semiconductor Field Effect Transistor), or the like that includes a control terminal.

The active region 40a is the region where a current flows when the semiconductor element 40 conducts. Here, the semiconductor element 40 conducting refers to a state in which a forward voltage is applied, and a current flows between the terminals to which the voltage is applied. For example, in the case of a diode such as a FRD, etc., this state is a state in which a current flows between the anode and the cathode when a potential that is higher than the potential of the cathode is applied to the anode. In the case of an n-type three-terminal element such as an IGBT, etc., this state is a state in which a current flows between the collector and the emitter when a potential that is higher than that of the emitter is applied to the gate, and a potential that is higher than that of the emitter is applied to the collector. For example, the anode and/or the collector are provided at the first major surface 49a; and the cathode and/or the emitter are provided at the second major surface 49a.

The semiconductor element 40 is blocked (or reverse-blocked) when a reverse voltage is applied between the electrode of the first major surface 49a and the electrode of the second major surface 49a. When the semiconductor element 40 is blocked, a sufficiently small current (a leakage current) flows compared to when conducting.

In the case where the semiconductor element 40 is a FRD, the FRD element, i.e., the diode, is formed in the active region 40a. In the case where the semiconductor element 40 is a MOSFET or an IGBT, for example, the unit cells are arranged.

A region that includes a guard ring structure or the like is provided at the periphery of the active region 40a. In this region, a current substantially does not flow even when conducting.

As shown in FIG. 3, the portion 32c is formed to correspond to the configuration of the semiconductor element 40 when projected onto the XY plane. The portion 32c is provided to protrude toward the semiconductor element 40 side.

The surface area of a connection surface 32s of the portion 32c with the semiconductor element 40 when projected onto the XY plane is set to be greater than the surface area of the active region 40a of the semiconductor element 40 when projected onto the XY plane. Joule heat is generated in the active region 40a by the current flowing when the semiconductor element 40 conducts. The portion 32c is electrically connected to the semiconductor element 40 and connected thermally to the semiconductor element 40. By setting the surface area of the connection surface 32s of the portion 32c when projected onto the XY plane to be greater than the surface area of the active region 40a when projected onto the XY plane, the Joule heat that is generated in the active region 40a spreads in the lateral direction at the connection portion with the portion 32c; therefore, the thermal resistance is reduced; and the heat dissipation performance improves. Accordingly, the semiconductor device 1 of the embodiment can control a large current with low heat generation.

In the example, two portions 32c are provided in the portion 32b. That is, one semiconductor unit 30 can include at least two semiconductor elements 40. The number of the portions 32c provided in the portion 32b is not limited to two and may be one or more than two.

The first metal member 31 is a substantially rectangular plate and is electrically connected to the semiconductor element 40 via the first bonding member 33 at a surface substantially parallel to the XY plane. The surface area of a connection surface 31s of the first metal member 31 connected to the semiconductor element 40 is substantially equal to the surface area of the portion 32b of the second metal member 32 and is sufficiently larger than the surface area of the active region 40a. Accordingly, the Joule heat that is generated in the active region 40a can spread in the lateral direction at the connection portion with the first metal member 31; and the thermal resistance is reduced.

The first bonding member 33 and the second bonding member 34 are, for example, solder and have a sufficiently large thermal conductivity.

The semiconductor element that is connected between the first metal member 31 and the second metal member 32 is not limited to one semiconductor element. In the case where two or more semiconductor elements are connected between the same first metal member 31 and second metal member 32, the same semiconductor element may be disposed; or different semiconductor elements may be disposed. In the case where different semiconductor elements are disposed, for example, an IGBT and a FRD may be connected in anti-parallel.

The first metal member 31, the first bonding member 33, the semiconductor element 40, the second bonding member 34, and the second metal member 32 which are stacked are stacked in this order and encapsulated with the insulating member 35 in a rectangular parallelepiped configuration. The insulating member 35 is, for example, a thermosetting resin such as an epoxy resin, etc. For example, the stacked body of the first metal member 31, the first bonding member 33, the semiconductor element 40, the second bonding member 34, and the second metal member 32 is disposed inside a resin mold in a vacuum state. The insulating member 35 is formed by injecting an encapsulating resin into the resin mold in which the stacked body is disposed and by curing the encapsulating resin. Thereby, the encapsulating can be performed without bubbles remaining at the periphery of the stacked body.

The description now continues by returning to FIG. 1. The first metal member 31 (the first terminal 31a) of the semiconductor unit 30 is electrically connected to the first surface 10a of the first metal plate 10 via the first connection member 51. The second metal member 32 (the second terminal 32a) of the semiconductor unit 30 is electrically connected to the first surface 20a of the second metal plate 20 via the second connection member 52.

To connect the multiple semiconductor units 30, the multiple semiconductor units 30 are disposed between the first metal plate 10 and the second metal plate 20 so that the direction in which the first terminal 31a is exposed and the direction in which the second terminal 32a is exposed are matched for each of the multiple semiconductor units 30. Specifically, for example, the first terminal 31a of each of the multiple semiconductor units 30 is disposed to face the positive direction of the Z-axis; and the second terminal 32a of each of the multiple semiconductor units 30 is disposed to face the negative direction of the Z-axis.

Thus, by disposing the semiconductor units 30, the first terminals 31a of the semiconductor units 30 are electrically connected to each other by the first metal plate 10. The second terminals 32a of the semiconductor units 30 are electrically connected to each other by the second metal plate 20. In the case where the semiconductor elements 40 include control terminals, for example, the control terminals are electrically connected to each other by connecting, to a metal plate for drawing out gate interconnects, the gate interconnects electrically connected by bonding wires before the resin encapsulation.

The first metal member 31 and the second metal member 32 function also as heat sinks.

FIG. 4 is a graph illustrating a characteristic of the semiconductor device of the embodiment.

As shown in FIG. 4, the maximum temperature of the semiconductor element 40 decreases as the thicknesses of the first metal member 31 and the second metal member 32 increase. Also, the maximum temperature of the semiconductor element 40 becomes substantially constant when the thicknesses of the first metal member 31 and the second metal member 32 each are 3 mm or more. In other words, if the thicknesses of the first metal member 31 and the second metal member 32 each are 3 mm or more, the first metal member 31 and the second metal member 32 function as heat sinks; and the heat generation of the semiconductor element 40 can be emitted externally. On the other hand, when the thicknesses of the first metal member 31 and the second metal member 32 become thinner than 3 mm, the dissipation of the heat is suppressed; and the temperature of the semiconductor element 40 increases. Accordingly, for example, it is desirable for the thicknesses of the first metal member 31 and the second metal member 32 each to be 4 mm or more.

A method for manufacturing the semiconductor device 1 of the embodiment will now be described.

In the semiconductor device 1 of the embodiment, first, the semiconductor unit 30 is assembled. For the assembled semiconductor unit 30, the first metal plate 10 and the second metal plate 20 are electrically connected to the semiconductor unit 30. Subsequently, the subdivided case 60 is mounted to the assembled body.

In the assembly of the semiconductor unit 30, for example, the semiconductor element 40 is electrically connected to the first metal member 31 via the first bonding member 33. At this time, one electrode of the semiconductor element 40 is connected to the first metal member 31.

Subsequently, the stacked body that includes the first metal member 31, the first bonding member 33, the semiconductor element 40, the second bonding member 34, and the second metal member 32 is formed of a resin using a resin encapsulation mold (the insulating member 35).

The assembled semiconductor unit 30 is electrically connected to the first surface 20a of the second metal plate 20 via the second connection member 52 at the second terminal 32a. Subsequently, the assembled semiconductor unit 30 is electrically connected to the first surface 10a of the first metal plate 10 via the first connection member 51. The first metal plate 10 may be connected firstly to the semiconductor unit 30; and the second metal plate 20 may be connected subsequently; or the first metal plate 10 and the second metal plate 20 may be connected simultaneously to the semiconductor unit 30.

For example, the assembled body that is formed as described above is enclosed with the case 60 subdivided into two portions. For example, the subdivided case 60 is connected using a bonding agent, etc.

Operations and effects of the semiconductor device 1 of the embodiment will now be described while comparing to a semiconductor device of a comparative example.

Figure 5:
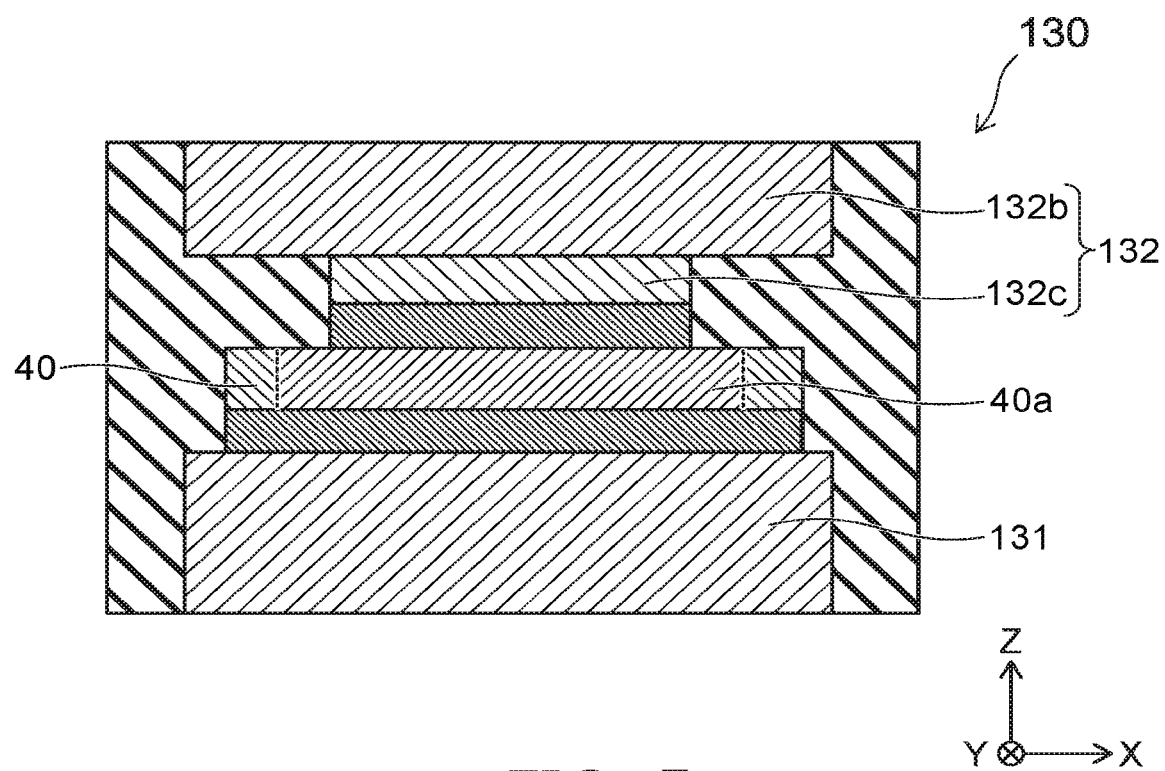
FIG. 5 is a cross-sectional view illustrating a portion of the semiconductor device of a comparative example.

FIG. 5 is a cross-sectional view illustrating a portion of the semiconductor device of the comparative example.

In FIG. 5, the active region 40a of the semiconductor element 40 is shown by broken lines. In the semiconductor device of the comparative example as shown in FIG. 5, a semiconductor unit 130 includes a first metal member 131 and a second metal member 132. The second metal member 132 includes portions 132b and 132c. The surface area of the portion 132c when projected onto the XY plane is less than the surface area of the active region 40a when projected onto the XY plane.

Therefore, the Joule heat that is generated in the active region 40a is dissipated via a path having a smaller surface area; therefore, the thermal resistance becomes large; and the heat dissipation performance of the semiconductor unit 130 decreases.

Conversely, in the semiconductor device 1 of the embodiment, the surface area of the semiconductor unit 30 when projected onto the XY plane of the first metal member 31 is greater than the surface area of the active region 40a when projected onto the XY plane. Also, the surface area of the portion 32c of the second metal member 32 when projected onto the XY plane is greater than the surface area of the active region 40a when projected onto the XY plane. Accordingly, the Joule heat that is generated in the active region 40a is emitted to spread into a metal member having a wider surface area. Therefore, the thermal resistance decreases; and the heat dissipation performance of the semiconductor unit 30 improves.

Also, in the semiconductor device 1 of the embodiment, the peripheries of the semiconductor element 40, the first bonding member 33, and the second bonding member 34 are encapsulated with the insulating member 35 to exhaust gases such as air, etc. Therefore, even in the case where the semiconductor element 40 and/or the first bonding member 33 and the second bonding member 34 each are in a high-temperature state due to electrical power concentration, etc., a gas that expands does not exist at the periphery; therefore, an abrupt volume expansion that may cause the semiconductor device 1 to rupture due to the expansion of the gas can be suppressed. That is, in the semiconductor device 1 of the embodiment, an explosion-proof structure can be realized by a simple structure.

In the semiconductor device 1 of the embodiment, the multiple semiconductor units 30 are disposed between the first metal plate 10 and the second metal plate 20 and electrically connected and thermally connected easily by the first and second connection members 51 and 52 such as solder, etc. By providing the mutual connection using the first and second connection members 51 and 52 such as solder, etc., the position setting when disposing the semiconductor units 30 is easy. Also, by using the first and second connection members 51 and 52 such as solder, etc., the thermal resistance and the electrical resistance can be uniform between the semiconductor units 30 without pressing.

(Modification)

Figure 6A:
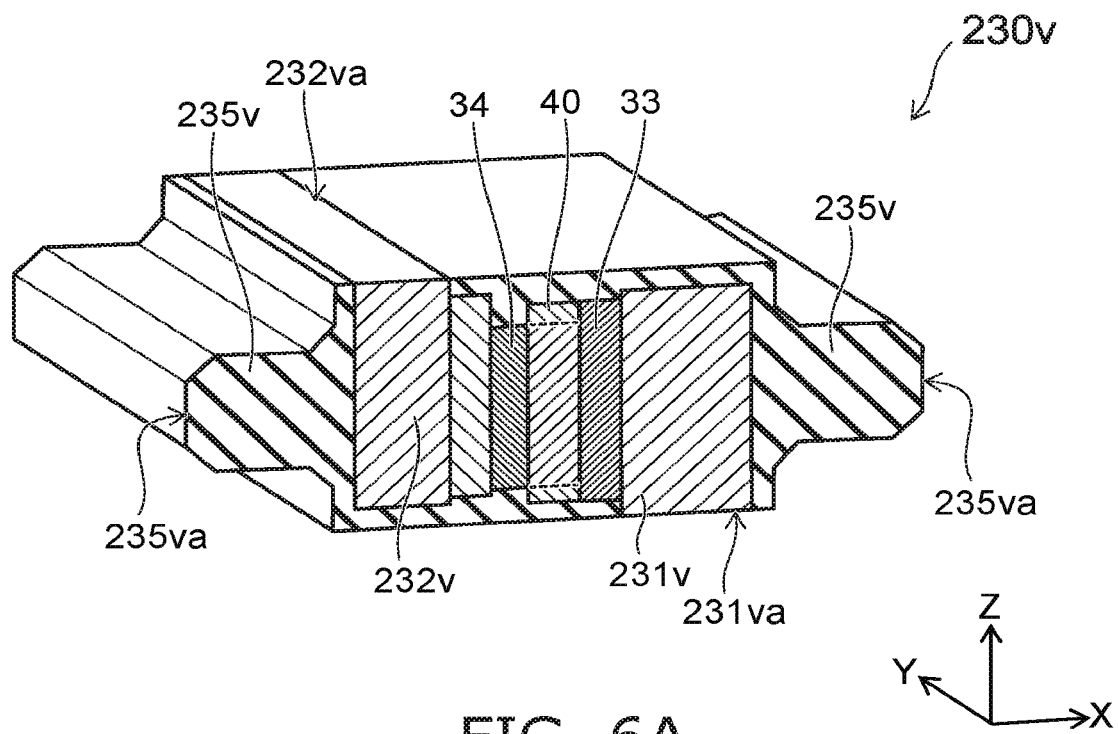
FIG. 6A and FIG. 6B are cross-sectional views illustrating portions of semiconductor devices of a modification of the first embodiment.
Figure 6B:
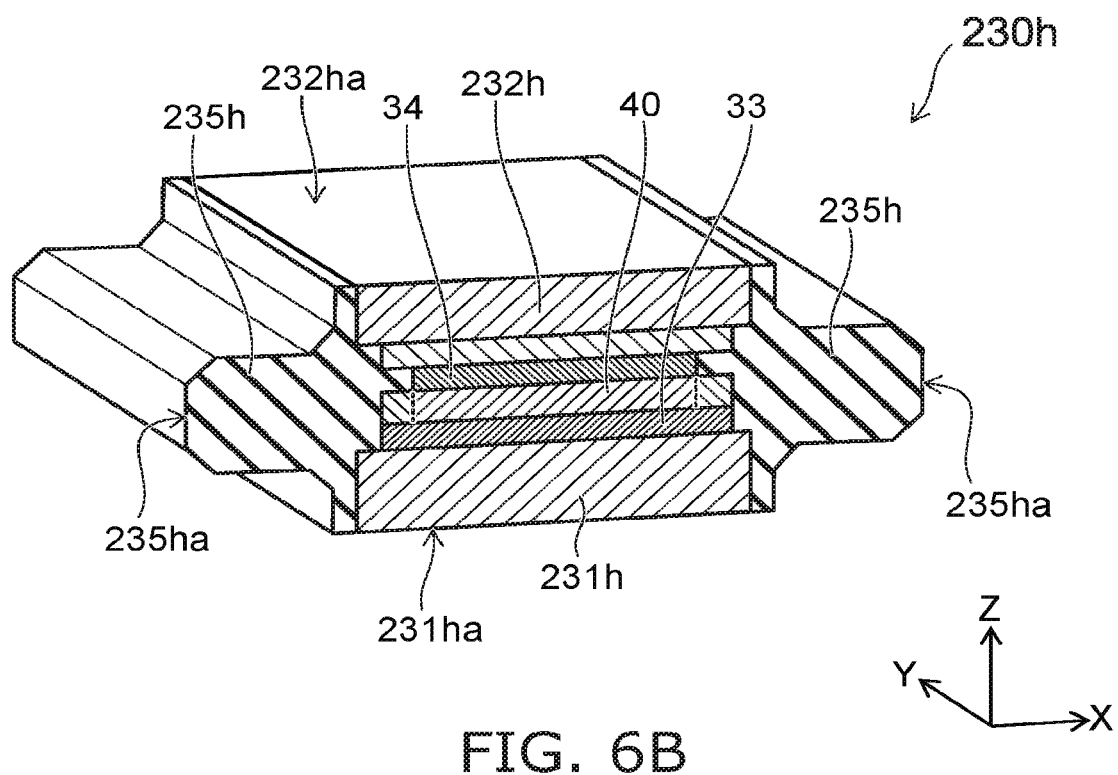

FIG. 6A and FIG. 6B are cross-sectional views illustrating portions of semiconductor devices of the modification.

In the modification, the configurations of semiconductor units 230v and 230h are different from those of the embodiment described above. Otherwise, the configurations are the same as the configuration described above; the same components are marked with the same reference numerals; and a detailed description is omitted.

As shown in FIG. 6A, the semiconductor unit 230v includes a first metal member 231v, a second metal member 232v, the semiconductor element 40, and an insulating member 235v. In the example, the semiconductor element 40 is provided between the first metal member 231v and the second metal member 232v which are disposed to be arranged in the lateral direction (the X-axis direction). A portion of the insulating member 235v extends to the upper surface and the lower surface of the semiconductor unit 230v and encapsulates the semiconductor element 40. The insulating member 235v has a convex surface 235va protruding in the lateral direction. Also, the side surface of the first metal member 231v and the side surface of the second metal member 232v are exposed respectively at the lower surface and the upper surface of the semiconductor unit 230v. The side surface of the first metal member 231v is a terminal 231va; and the side surface of the second metal member 232v is a terminal 232va. The semiconductor unit 230v is electrically connected to the first metal plate 10 by the first terminal 231va, and electrically connected to the second metal plate 20 by the second terminal 232va.

Thus, the semiconductor unit 230v may be disposed in an orientation crossing the direction in which the first surface of the first metal plate and the first surface of the second metal plate extend (a direction parallel to the XY plane). Thereby, the creepage distances of the first terminal 231a and the second terminal 232a can be easily set to be longer than those of the semiconductor unit 30 of the first embodiment. Also, because an insulating member 235 has a convex surface 235a, the creepage distance between the first terminal 231a and the second terminal 232a can be extended further.

Although the semiconductor unit 230v is disposed in an orientation crossing the direction in which the first surface extends in the modification described above, the semiconductor unit 230h may be disposed in the same orientation as the direction in which the first surface extends similarly to that of the first embodiment. As shown in FIG. 6B, the semiconductor unit 230h includes a first metal member 231h, a second metal member 232h, the semiconductor element 40, and an insulating member 235h. The first metal member 231h and the second metal member 232h extend in the X-direction and the Y-direction; and a first terminal 231ha and a second terminal 232ha are provided to be substantially parallel to the XY plane. The insulating member 235h has a convex surface 235ha.

As in these modifications, the amount of the encapsulating resin is high at the portions where the convex surfaces 235va and 235ha are formed. Therefore, by providing the convex surfaces 235va and 235ha at positions opposing the surfaces of the semiconductor element 40, the stress of the resin encapsulation can be relaxed; and the characteristic degradation of the semiconductor element, etc., can be prevented.

Second Embodiment

Figure 7:
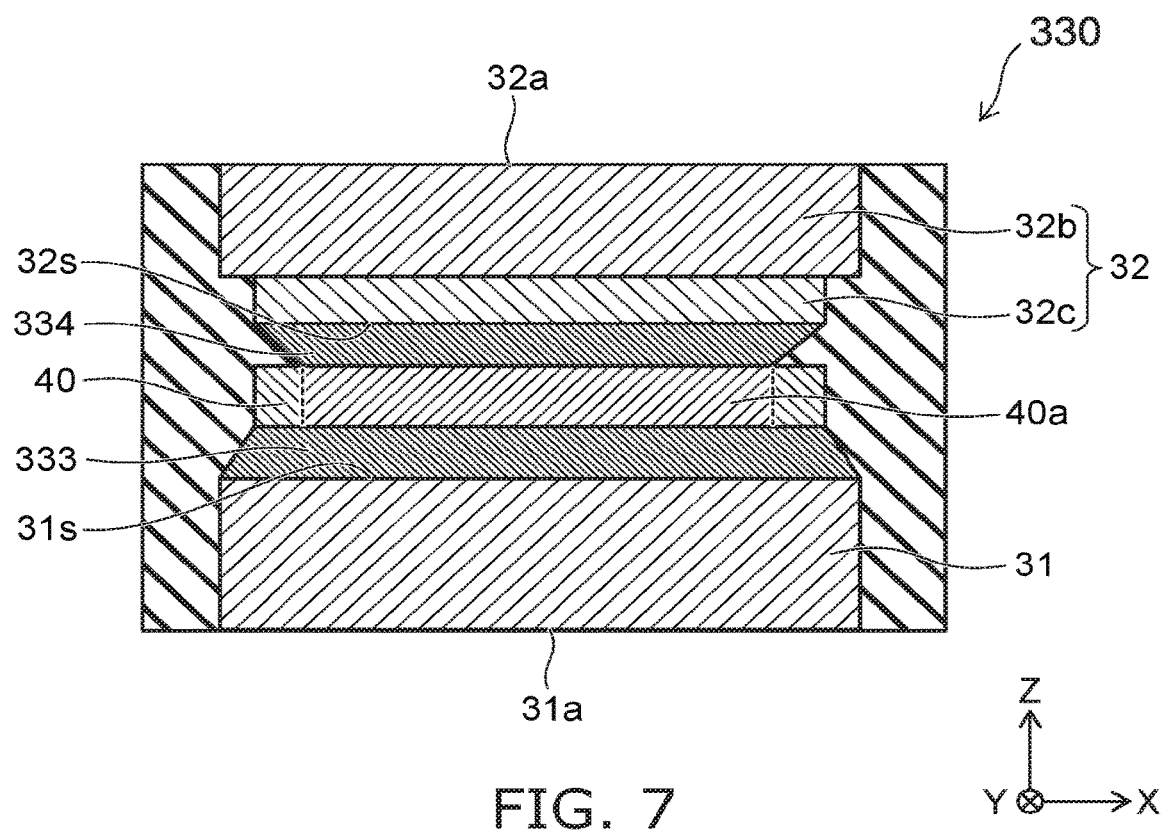
FIG. 7 is a cross-sectional view illustrating a portion of a semiconductor device of a second embodiment.

FIG. 7 is a cross-sectional view illustrating a portion of a semiconductor device according to the embodiment.

The semiconductor device of the embodiment includes a semiconductor unit 330. In the embodiment, the components of the semiconductor unit 330 are different from those of the other embodiments and modifications described above. Otherwise, the components are the same as those of the other embodiments, etc., described above; therefore, the same components are marked with the same reference numerals; and a detailed description is omitted.

As shown in FIG. 7, the semiconductor unit 330 includes a first bonding member 333 and a second bonding member 334. The first bonding member 333 is provided between the first metal member 31 and the semiconductor element 40 and electrically and thermally connects the first metal member 31 and the semiconductor element 40. The surface area of the connection surface 31s of the first metal member 31 with the semiconductor element 40 is set to be greater than the surface area of the active region 40a of the semiconductor element 40 when projected onto the XY plane. Also, the connection surface of the first bonding member with the first metal member 31 covers the entire surface of the connection surface 31s of the first metal member 31.

The second bonding member 334 is provided between the second metal member 32 and the semiconductor element 40 and electrically and thermally connects the second metal member 32 and the semiconductor element 40. The surface area of the connection surface 32s of the second metal member 32 with the semiconductor element 40 is set to be greater than the surface area of the active region 40a of the semiconductor element 40 when projected onto the XY plane; and the connection surface of the second bonding member 334 with the second metal member 32 covers the entire surface of the connection surface 32s of the second metal member 32.

Accordingly, the first bonding member 333 and the second bonding member 334 are connected thermally to the first metal member 31 and the second metal member 32 with a surface area that is greater than the surface area of the active region 40a of the semiconductor element 40. The Joule heat that is generated in the active region 40a can spread and be conducted outward at the peripheral edge of the active region 40a; therefore, the thermal resistance of the semiconductor unit 330 is reduced; and the heat dissipation performance improves.

For example, the first bonding member 333 and the second bonding member 334 each are solder. In the case where one electrode of the semiconductor element 40 and the first metal member 31 are connected and the other electrode of the semiconductor element 40 and the second metal member 32 are connected using the first bonding member 333 and the second bonding member 334 which are solder, the amount of the solder is set appropriately; thereby, the solder wets and can cover the entire connection surface of the first metal member 31 and the second metal member 32 when the solder is melted.

Third Embodiment

Figure 8:
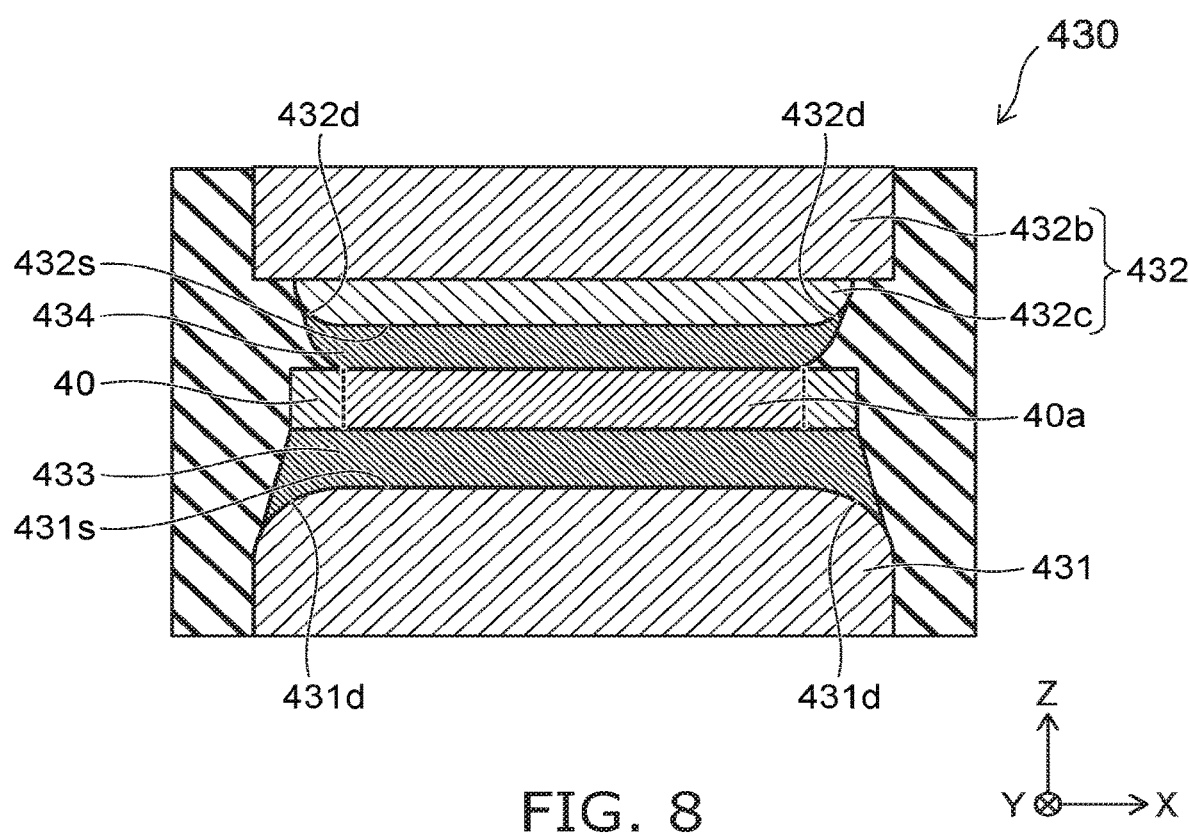
FIG. 8 is a cross-sectional view illustrating a portion of a semiconductor device of a third embodiment.

FIG. 8 is a cross-sectional view illustrating a portion of a semiconductor device of the embodiment.

In the embodiment, a first metal member 431, a second metal member 432, a first bonding member 433, and a second bonding member 434 are different from those of the other embodiments described above.

In the semiconductor device of the embodiment as shown in FIG. 8, a corner portion 431d of a connection surface 431s of the first metal member 431 with the semiconductor element 40 in a semiconductor unit 430 is beveled. Also, a corner portion 432d of a connection surface 432s of a second metal member 432 with the semiconductor element 40 in the semiconductor unit 430 is beveled. For example, the corner portions 431d and 432d respectively of the beveled first metal member 431 and the beveled second metal member 432 are patterned into curved configurations. The corner portions 431d and 432d may be beveled into linear configurations.

The first bonding member 433 is provided to cover the connection surface 431s including the corner portion 431d of the first metal member 431. The second bonding member 434 is provided to cover the connection surface 432s including the corner portion 432d of the second metal member 432. Similarly to the second embodiment, the first bonding member 433 and the second bonding member 434 are, for example, solder. Accordingly, due to the wetting of the first bonding member 433 and the second bonding member 434 which are solder, the first bonding member 433 and the second bonding member 434 cover the entire surface of the connection surfaces 431s and 432s including the corner portions 431d and 432d when the solder melts.

In the semiconductor unit 430 of the semiconductor device of the embodiment, the corner portions 431d and 432d of the connection surfaces 431s and 432s of the first metal member 431 and the second metal member 432 with the semiconductor element 40 are beveled. Therefore, for example, the first bonding member 433 and the second bonding member 434 which are solder cover the entire connection surfaces 431s and 432s including the corner portions 431d and 432d of the first metal member 431 and the second metal member 432; and the thermal resistance can be reduced effectively. By providing the beveled corner portions 431d and 432d, the connection surface area of the first bonding member 433 on the first metal member 431 side and the connection surface area of the second bonding member 434 on the second metal member 432 side are larger than in the case where beveling is not performed; therefore, the thermal resistance is reduced; and the heat dissipation performance improves.

Fourth Embodiment

Figure 9A:
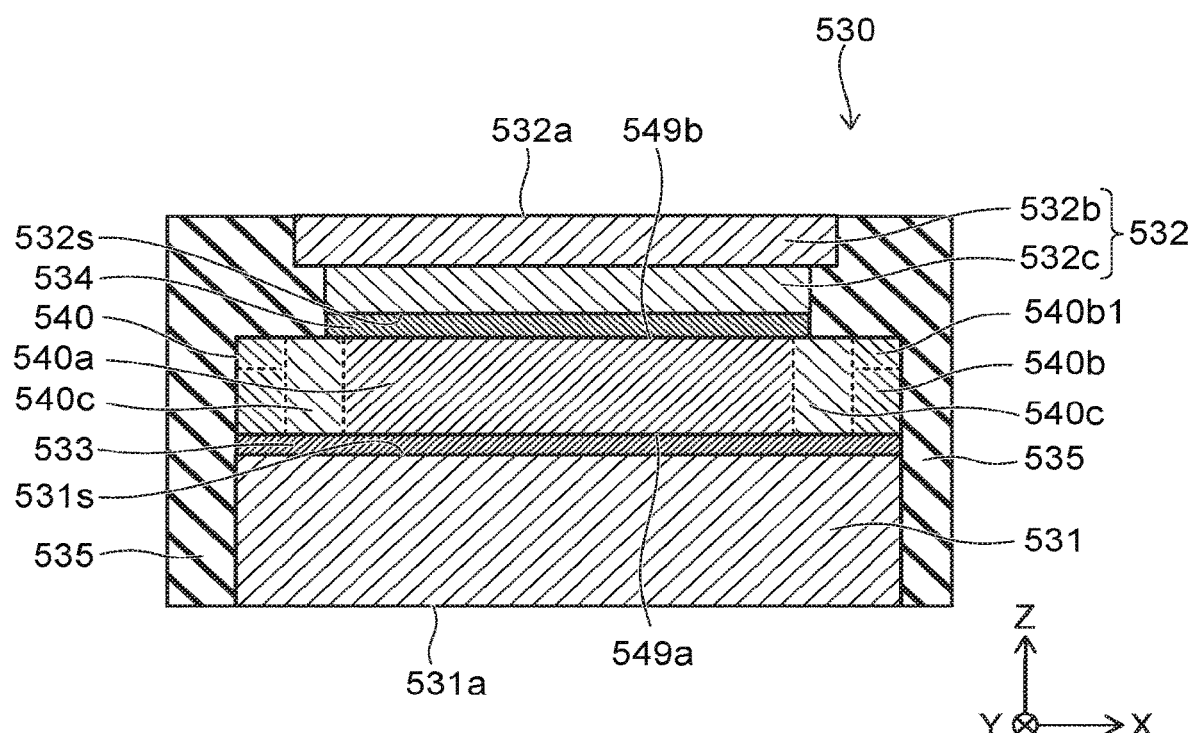
FIG. 9A is a cross-sectional view illustrating a semiconductor device of a fourth embodiment.
Figure 9B:
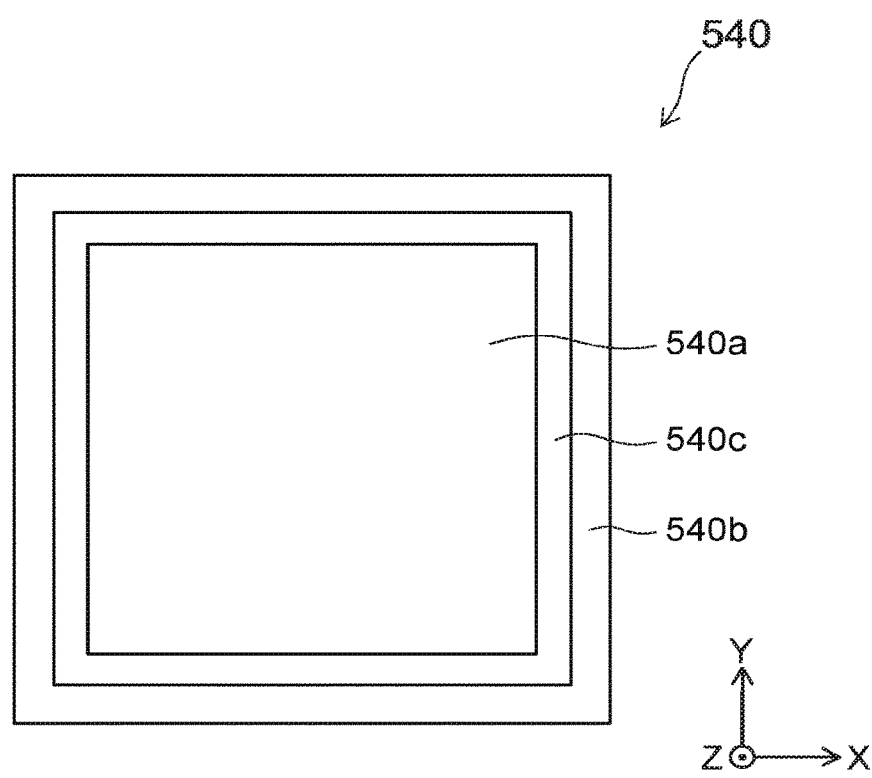
FIG. 9B is a plan view illustrating a portion of the semiconductor device of the fourth embodiment.

FIG. 9A is a cross-sectional view illustrating a semiconductor device of the embodiment. FIG. 9B is a plan view illustrating a portion of the semiconductor device of the embodiment.

The embodiment differs from the other embodiments described above in that the second bonding member is connected to the semiconductor element outside the outer perimeter of the active region. In the semiconductor element, a non-conduction region is provided between the active region and the guard ring formation region so that the second bonding member does not contact the guard ring formation region.

As shown in FIG. 9A, a semiconductor unit 530 includes a first metal member 531, a second metal member 532, a first bonding member 533, a second bonding member 534, an insulating member 535, and a semiconductor element 540. The first metal member 531, the first bonding member 533, the semiconductor element 540, the second bonding member 534, and the second metal member 532 are stacked in the Z-axis direction in this order. A portion of the first metal member 531, a portion of the second metal member 532, the first bonding member 533, the second bonding member 534, and the semiconductor element 540 are covered with the insulating member 535.

The semiconductor unit 530 includes a first terminal 531a and a second terminal 532a. The first terminal 531a is a portion of the first metal member 531 not covered with the insulating member 535. The second terminal 532a is a portion of the second metal member 532 not covered with the insulating member 535.

The second metal member 532 includes portions 532b and 532c. The portion 532b is a substantially rectangular plate-like member; and the portion 532c is a protrusion protruding from the portion 532b toward the semiconductor element 540 side. The surface of the portion 532c on the semiconductor element 540 side is flat and is connected to the semiconductor element 540.

The semiconductor element 540 includes an active region 540a, a guard ring formation region 540b, and a non-conduction region 540c. The active region 540a and the guard ring formation region 540b are the same as those of the other embodiments described above. The non-conduction region 540c is provided between the active region 540a and the guard ring formation region 540b. When projected onto the XY plane as shown in FIG. 9B, the non-conduction region 540c surrounds the periphery of the active region 540a. The guard ring formation region 540b surrounds the outer perimeter of the non-conduction region 540c.

The semiconductor element 540 has a first major surface 549a which is on the side connected to the first metal member 531, and a second major surface 549b which is on the side connected to the second metal member 532. The guard ring formation region 540b includes a guard ring 540b1; and the guard ring 540b1 is formed on the second major surface 549b side.

When the semiconductor element 540 conducts, a current flows along the Z-axis direction in the active region 540a; but a current substantially does not flow in the non-conduction region 540c and the guard ring formation region 540b including the guard ring 540b1. Accordingly, a low potential is maintained in the non-conduction region 540c on the second major surface 549b side even in the case where a reverse voltage is applied to the semiconductor element 540, that is, in the case where a high potential is applied to the first major surface 549a.

The portion 532c of the second metal member 532 is electrically connected to the semiconductor element 540 via the second bonding member 534 on the second major surface 549b side. The surface area of a connection surface 532s of the portion 532c is greater than the surface area of the active region 540a when projected onto the XY plane.

The second bonding member 534 is, for example, solder and wets and spreads over the entire surface of the connection surface 532s of the second metal member 532. Also, by appropriately controlling the amount of the second bonding member 534 which is solder, the outer perimeter of the connection surface of the second bonding member 534 can be outward from the boundary between the active region 540a and the non-conduction region 540c and inward from the boundary between the non-conduction region 540c and the guard ring formation region 540b. That is, the second metal member 532 and the second bonding member 534 can be provided in a range not in contact with the guard ring formation region 540b.

At the semiconductor element 540 on the first major surface 549a side, the semiconductor element 540 is electrically connected to the first metal member 531 via the first bonding member 533. The surface area of a connection surface 531s of the first metal member 531 is greater than the surface area of the active region 540a when projected onto the XY plane. For example, an electrode is formed on the entire surface of the semiconductor element 540 on the first major surface 549a side; and the first bonding member 533 is connected. Accordingly, the connection surface area of the first bonding member 533 on the semiconductor element 540 side is greater than the surface area of the active region 540a when projected onto the XY plane.

The non-conduction region 540c reduces the connection surface area between the active region 540a and the second bonding member 534 and favorably is formed of a material having high thermal conductivity. For example, the non-conduction region 540c is formed of a semiconductor layer having a high resistance. Other than a high-resistance semiconductor layer, the non-conduction region 540c may be an insulating layer including an oxide, a nitride, etc.

In the embodiment, the semiconductor unit 530 includes the semiconductor element 540 including the non-conduction region 540c; therefore, the second metal member 532 and the second bonding member 534 can be prevented from contacting the guard ring formation region 540b and the guard ring 540b1. By appropriately setting the distance to the guard ring formation region 540b when the non-conduction region 540c is projected onto the XY plane, the distance to the guard ring formation region 540b from the outer perimeters of the second metal member 532 and the second bonding member 534 can be maintained appropriately; and the insulation can be realized reliably.

Figure 10:
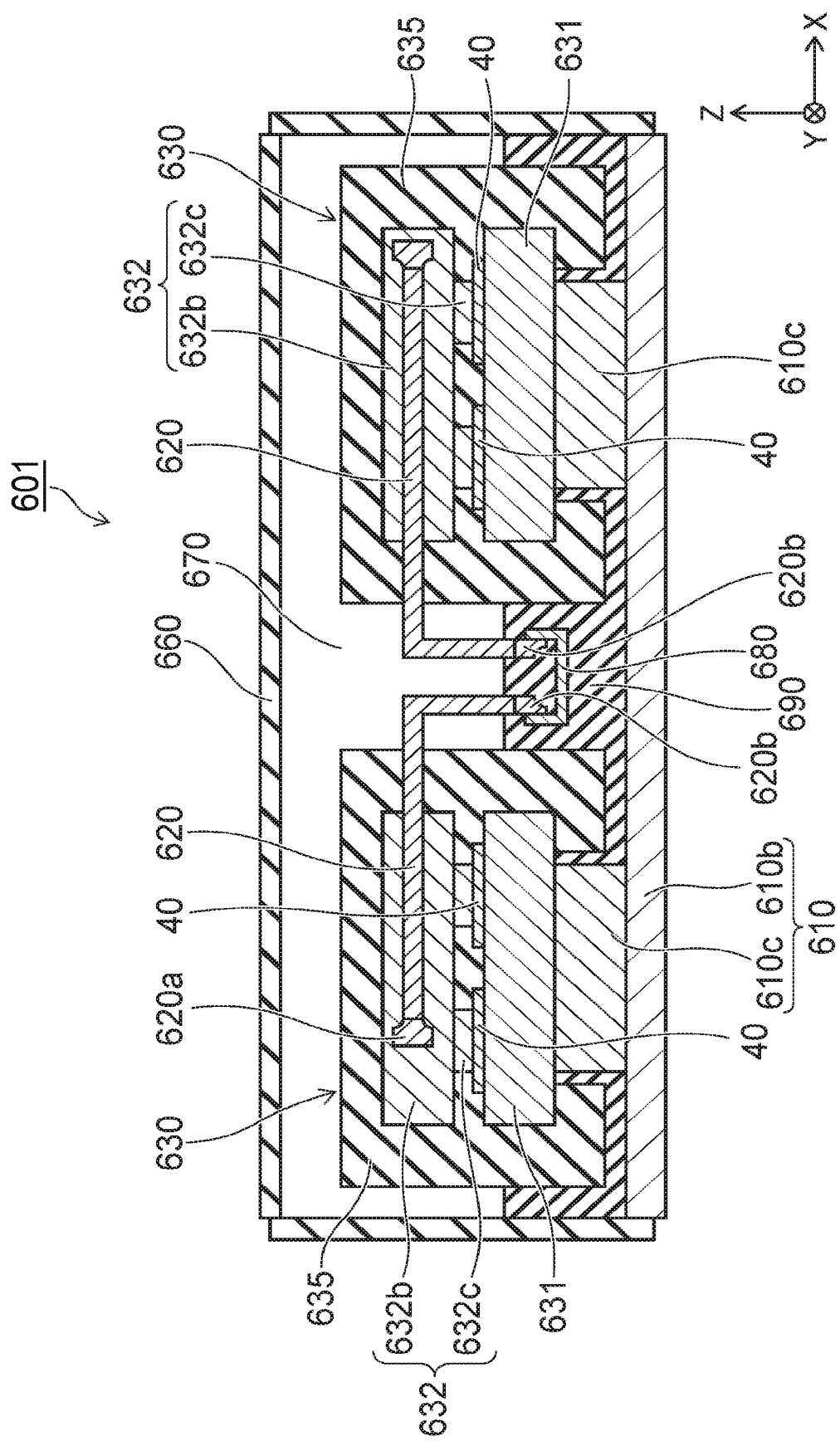
FIG. 10 is a cross-sectional view a semiconductor device according to a fifth embodiment.

FIG. 10 is a cross-sectional view illustrating a semiconductor device according to a fifth embodiment.

Figure 11A:
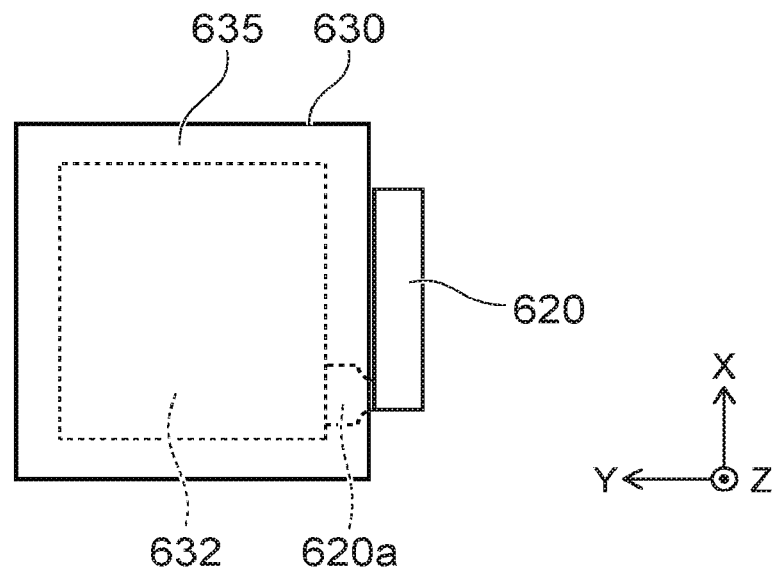
FIG. 11A is a top view of a portion of the semiconductor device of the fifth embodiment.

FIG. 11A is a top view of a portion of the semiconductor device; and FIG. 10B is a side view.

Figure 11B:
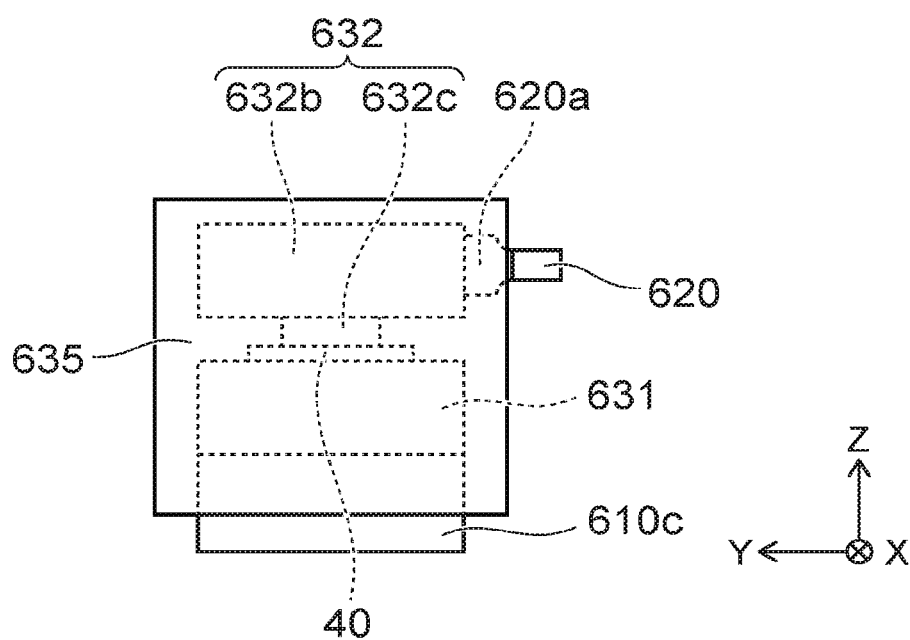
FIG. 11B is a side view.

As shown in FIG. 10 to FIG. 11B, the semiconductor device 601 includes a metal member 610, multiple semiconductor units 630 mounted on the metal member 610, a major circuit interconnect 680, multiple bus bars 620 connecting the major circuit interconnect 680 respectively to the multiple semiconductor units 630, and a case 660 made of an insulating resin.

The metal member 610 includes a plate portion 610b and multiple protrusions (or columnar portions) 610c. The multiple protrusions 610c are provided as one body with the plate portion 610b on one surface of the plate portion 610b. The semiconductor units 630 are mounted on the protrusions 610c. The metal member 610 corresponds to the first metal plate 10 of the other embodiments described above.

The lower end portion of the case 660 is bonded to the plate portion 610b of the metal member 610; and an encapsulated space is formed inside the metal member 610 and the case 660. The major circuit interconnect 680 is disposed in the encapsulated space in a region 670 other than the region where the multiple semiconductor units 630 are provided.

Similarly to the embodiments described above, the semiconductor unit 630 includes a first metal member 631, a second metal member 632 disposed above the first metal member 631, the semiconductor element 40 disposed between the first metal member 631 and the second metal member 632, and an electrically insulative insulating member 635.

The second metal member 632 includes two portions 632b and 632c; and the portion 632c is a protrusion provided on the portion 632b having a plate configuration. The surface area of the portion 632c when projected onto the XY plane is set to be greater than the surface area of the active region 40a of the semiconductor element 40 when projected onto the XY plane (referring to FIG. 2, etc.). Therefore, similarly to the other embodiments described above, the heat generation path of the semiconductor element 40 is ensured; and the thermal resistance is reduced.

The embodiments described above are applicable to the forms of the bonding members for bonding the first metal member, the second metal member, and the semiconductor element in the semiconductor unit.

The major circuit interconnect 680 is disposed between the multiple semiconductor units 630. The major circuit interconnect 680 is a metal interconnect having a plate configuration and is, for example, a copper interconnect. The major circuit interconnect 680 is provided inside a resin 690 formed on the metal member 610 and is held on the metal member 610 by the resin 690. A portion of the major circuit interconnect 680 protrudes outside the case 660 as a major electrode terminal (e.g., an emitter terminal or a cathode terminal).

The bus bar 620 is bonded to the plate-like portion 632b of the second metal member 632 of the semiconductor unit 630. Metal foot portions 620a and 620b are provided at the two end portions of the bus bar 620. The metal foot portions 620a and 620b are, for example, copper brazed to the bus bar 620. The bus bar 620 corresponds to the second metal plate 20 of the other embodiments described above.

The metal foot portion 620a at one end of the bus bar 620 is bonded or fastened by screwing to the side surface of the second metal member 632. Or, the metal foot portion 620a may be bonded or fastened by screwing to the upper surface of the second metal member 632.

The metal foot portion 620b at the other end of the bus bar 620 is bonded or fastened by screwing to the major circuit interconnect 680. The resin 690 covers and protects the bonding portion between the major circuit interconnect 680 and the metal foot portion 620b.

The bus bar 620 is made of, for example, an electrically conductive material such as copper, alloy-42 (an alloy of nickel and iron), an alloy of nickel and chrome, etc. For example, the bus bar 620 is formed in a plate configuration or is formed in a configuration in which a plate member is bent to zigzag. The bending of the bus bar 620 in a zigzag means that many bent portions are provided in the direction in which the current flows; thereby, the length of the bus bar 620 substantially lengthens; and the resistance value increases.

The electrical resistance of the bus bar 620 is higher than the electrical resistance of the major circuit interconnect 680. A cross-sectional area S (cm$^2$) of the cross section of the bus bar 620 perpendicular to the direction in which the current flows and a length (a current path length) L (cm) are determined by the following formula for an electrical resistance R ($\Omega$) determined for the bus bar 620.

$$R=\rho_0 \times L/S (\Omega)(\rho_0\text{:volume resistivity}(\Omega\text{cm}))$$

For example, the electrical resistance of the bus bar 620 is set to be higher than the electrical resistance of the major circuit interconnect 680 by using, as the material of the bus bar 620, a material having a higher volume resistivity than the major circuit interconnect 680. To reduce the electrical resistance and reduce the heat generation, it is desirable for the material of the major circuit interconnect 680 to be a material having a smaller volume resistivity than the bus bar 620. For example, the material of the major circuit interconnect 680 is copper; and the material of the bus bar 620 is alloy-42 (an alloy of nickel and iron) or an alloy of nickel and chrome.

One semiconductor unit 630 is electrically connected to the major circuit interconnect 680 by at least one bus bar 620. The multiple semiconductor units 630 are electrically connected in parallel between the metal member 610 and the major circuit interconnect 680 via the multiple bus bars 620.

The current flows in the vertical direction (the stacking direction), i.e., the Z-axis direction, of the semiconductor unit 630. The current flows between the metal member 610 and the major circuit interconnect 680 via the semiconductor unit 630 and the bus bar 620.

There is a possibility that a short circuit current may flow in the semiconductor element 40 and generate Joule heat; thereby, the semiconductor element 40 may breakdown; and the semiconductor unit 630 may rupture due to the increase of the pressure inside the semiconductor unit 630.

Therefore, according to the embodiment shown in FIG. 10, by connecting the bus bar 620 having a somewhat high electrical resistance value in series to the semiconductor units 630, the energy consumption is distributed to the bus bar 620 and the semiconductor element 40; and the Joule heat that is generated in the semiconductor element 40 can be suppressed.

In a normal operation (a normal operation), current division of the current occurs in the bus bars 620; therefore, a Joule heat Q generated per one bus bar 620 is $Q=R\times(\text{Itotal}/\text{number in parallel})^2$ (J), wherein Itotal is the total of the current flowing in the multiple semiconductor units 630 (R being the electrical resistance ($\Omega$) of the bus bar 620).

A current flows in the semiconductor unit 630 including the malfunctioning semiconductor element 40; and a current does not flow in the normal semiconductor unit 630. A Joule heat Q' that is generated in the bus bar 620 connected to the malfunctioning semiconductor unit 630 is $Q'=R\times(\text{Itotal})^2$ (J).

Compared to when malfunctioning, the loss occurrence effect with respect to the current value flowing in the semiconductor unit 630 in the normal operation is $Q/Q'=(1/\text{number in parallel})^2$; and the loss occurrence in the normal operation can be lower than when malfunctioning.

Due to the parallel connection effect of the multiple bus bars 620, by the bus bar 620 connected to the malfunctioning semiconductor unit 630 consuming energy when malfunctioning without degrading the efficiency of the semiconductor unit 630 in the normal operation, the Joule heat that is generated in the semiconductor element 40 can be suppressed; and the rupture of the semiconductor unit 630 can be suppressed.

In other words, when malfunctioning, the short circuit current flows only in the malfunctioning semiconductor unit 630 and the bus bar 620 connected in series to the semiconductor unit 630; and a large Joule heat can be generated in the bus bar 620. Thereby, the Joule heat that is generated by the semiconductor element 40 in which the short circuit current flows can be reduced; and the breakdown can be suppressed.

Because the multiple bus bars 620 are connected in parallel between the metal member 610 and the major circuit interconnect 680, the current value that flows in each of the bus bars 620 in the normal operation is a value of the output current of the power semiconductor module divided by the number in parallel; and the Joule heat of the normal operation can be suppressed.

According to the embodiments described above, a highly safe semiconductor device can be realized in which a large current output is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

The invention claimed is:

1. A semiconductor device, comprising:
a first metal plate;
a second metal plate provided to be separated from the first metal plate; and
two or more semiconductor units disposed on the first metal plate and connected to the second metal plate,
each of the two or more semiconductor units including
a first metal member electrically connected to the first metal plate,
a second metal member electrically connected to the second metal plate and provided to be separated from the first metal member, and
a semiconductor element provided between the first metal member and the second metal member, connected to the first metal member at a first major surface, and connected to the second metal member at a second major surface, the second major surface being on a side opposite to the first major surface,
the first metal member having a first connection surface connected to the first major surface,
the second metal member having a second connection surface connected to the second major surface,
the semiconductor element including an active region, the active region being surrounded by a periphery region in a top view, the periphery region not flowing a current when the semiconductor element conducts, the active region having surfaces respectively opposing the first connection surface and the second connection surface,
a surface area of the first connection surface being greater than a surface area of the surface of the active region, in the top view, opposing the first connection surface,
a surface area of the second connection surface being greater than a surface area of the surface of the active region, in the top view, opposing the second connection surface; and
further comprising:
a first connection member provided between the first metal plate and the semiconductor unit, the first connection member being electrically conductive; and
a second connection member provided between the second metal plate and the semiconductor unit, the second connection member being electrically conductive,
the first metal plate having a first surface,
the second metal plate having a second surface opposing the first surface,
the two or more semiconductor units being disposed between the first metal plate and the second metal plate,
each of the first metal members being connected electrically to the first metal plate via the first connection member,
the second metal member being electrically connected to the second metal plate via the second connection member.

2. The semiconductor device according to claim 1, wherein
the first connection member covers an entire of the first connection surface, and
the second connection member covers an entire of the second connection surface.

3. The semiconductor device according to claim 2, wherein
the first connection surface and the second connection surface each include a beveled corner portion, and
the first connection member and the second connection member respectively cover the corner portions.

4. The semiconductor device according to claim 1, wherein
the semiconductor element includes:
a guard ring formation region provided along an outer perimeter of the semiconductor element at a periphery of the active region; and
a non-conduction region provided between the active region and the guard ring formation region, a resistivity of the non-conduction region being higher than a resistivity of the active region.

5. The semiconductor device according to claim 4, wherein the non-conduction region includes a heat-dissipating member.

6. The semiconductor device according to claim 4, wherein an outer edge of at least one of the first metal member or the second metal member is between a boundary between the active region and the non-conduction region and a boundary between the non-conduction region and the guard ring formation region.

7. The semiconductor device according to claim 1, further comprising a major circuit interconnect respectively connected to the second metal plate,
the major circuit interconnect being provided in a region other than a region where the two or more semiconductor units are provided,
a resistance value of the second metal plate being higher than a resistance value of the major circuit interconnect.

8. The semiconductor device according to claim 7, wherein the second metal plate includes a plurality of bent portions along a direction, a current flowing in the direction.

9. The semiconductor device according to claim 1, wherein the two or more semiconductor units include semiconductor elements having different functions.

* * * * *